United States Patent
Ono et al.

(10) Patent No.: US 9,590,093 B2
(45) Date of Patent: Mar. 7, 2017

(54) SEMICONDUCTOR DEVICE

(71) Applicant: Kabushiki Kaisha Toshiba, Minato-ku, Tokyo (JP)

(72) Inventors: Syotaro Ono, Kanazawa Ishikawa (JP); Hideyuki Ura, Hakusan Ishikawa (JP); Masahiro Shimura, Hakusan Ishikawa (JP); Hiroaki Yamashita, Hakusan Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/642,345

(22) Filed: Mar. 9, 2015

(65) Prior Publication Data

US 2016/0035879 A1 Feb. 4, 2016

(30) Foreign Application Priority Data

Jul. 31, 2014 (JP) ................................. 2014-156048
Mar. 4, 2015 (JP) ................................. 2015-042034

(51) Int. Cl.
*H01L 29/73* (2006.01)
*H01L 29/78* (2006.01)
(Continued)

(52) U.S. Cl.
CPC ...... *H01L 29/7811* (2013.01); *H01L 29/0634* (2013.01); *H01L 29/086* (2013.01);
(Continued)

(58) Field of Classification Search
CPC .. H01L 21/8222; H01L 29/73; H01L 29/7393
See application file for complete search history.

(56) References Cited

U.S. PATENT DOCUMENTS 6,849,880 B1   2/2005  Saito et al.
7,049,658 B2   5/2006  Saito et al.
(Continued)

FOREIGN PATENT DOCUMENTS

JP   2004-072068 A   3/2004
JP   2008-159601 A   7/2008
JP   2008-258442 A   10/2008

OTHER PUBLICATIONS

Korean Office Action issued on Jan. 26, 2016 in corresponding Korean Application No. 10-2015-0009896, along with English translation thereof.

*Primary Examiner* — Jae Lee
(74) *Attorney, Agent, or Firm* — White & Case LLP

(57) ABSTRACT

In general, according to one embodiment, a semiconductor device includes, a first semiconductor region, a plurality of second semiconductor regions, a plurality of third semiconductor regions, a fourth semiconductor region, a fifth semiconductor region, and a gate electrode. The third semiconductor region includes a first portion and a second portion. The first portion is provided between the second semiconductor regions adjacent to each other. An amount of impurity of the second conductivity type in the first portion is greater than an amount of impurity of the first conductivity type in the second semiconductor region contiguous to the first portion. The second portion is arranged with a part of the first semiconductor region. An amount of impurity of the second conductivity type in the second portion is smaller than an amount of impurity of the first conductivity type in the part of the first semiconductor region.

15 Claims, 4 Drawing Sheets

(51) Int. Cl.
  *H01L 29/739*   (2006.01)
  *H01L 29/10*    (2006.01)
  *H01L 29/08*    (2006.01)
  *H01L 29/36*    (2006.01)
  *H01L 29/06*    (2006.01)

(52) U.S. Cl.
  CPC ...... *H01L 29/0869* (2013.01); *H01L 29/0878* (2013.01); *H01L 29/0886* (2013.01); *H01L 29/1095* (2013.01); *H01L 29/36* (2013.01); *H01L 29/7395* (2013.01)

(56) References Cited

U.S. PATENT DOCUMENTS

| | | |
|---|---|---|
| 7,294,886 B2 | 11/2007 | Saito et al. |
| 7,759,733 B2 | 7/2010 | Ono et al. |
| 2004/0129973 A1 | 7/2004 | Saito et al. |
| 2006/0071267 A1 | 4/2006 | Saito et al. |
| 2007/0272977 A1* | 11/2007 | Saito .................. H01L 29/0634 257/329 |
| 2013/0026560 A1 | 1/2013 | Onishi et al. |

* cited by examiner

SEMICONDUCTOR DEVICE

CROSS-REFERENCE TO RELATED APPLICATIONS

This application is based upon and claims the benefit of priority from Japanese Patent Application No. 2014-156048, filed on Jul. 31, 2014 and No. 2015-042034, filed on Mar. 4, 2015; the entire contents of which are incorporated herein by reference.

FIELD

Embodiments described herein relate generally to a semiconductor device.

BACKGROUND

Semiconductor devices such as MOSFETs (Metal Oxide Semiconductor Field Effect Transistors) or IGBTs (Insulated Gate Bipolar Transistors) have been widely used for household electrical appliances, communication apparatuses, power conversion apparatuses or power control apparatuses such as for vehicle-mounted motors, and the like. For the semiconductor devices, a high-speed switching characteristic or a reverse blocking characteristic (breakdown voltage) of several tens to several hundreds of volts is required in many cases.

The on-resistance of the semiconductor devices greatly depend on the electrical resistance of a drift region. The electrical resistance of the drift region depends on the concentration of impurity in the drift region. The concentration limit of impurity in the drift region is determined according to the breakdown voltage of a p-n junction formed between a base region and the drift region. That is, the breakdown voltage decreases when the concentration of impurity in the drift region is increased, while the concentration of impurity in the drift region is lowered when the breakdown voltage is increased. For this reason, there is a trade-off relationship between the breakdown voltage and the on-resistance.

As one means of decreasing the on-resistance while maintaining the breakdown voltage, there is a method in which a super junction structure is used for the drift region. In the super junction structure, a plurality of p-type pillar regions and a plurality of n-type pillar regions are alternately provided in a substrate in-plane direction. In the super junction structure, by making the amount of impurity contained in the p-type pillar region equal to the amount of impurity contained in the n-type pillar region, the concentration of impurity in the drift region can be increased while maintaining the breakdown voltage.

In the semiconductor devices, however, a technique for further improving the breakdown voltage while suppressing an increase in on-resistance is required.

DETAILED DESCRIPTION

Figure 1:
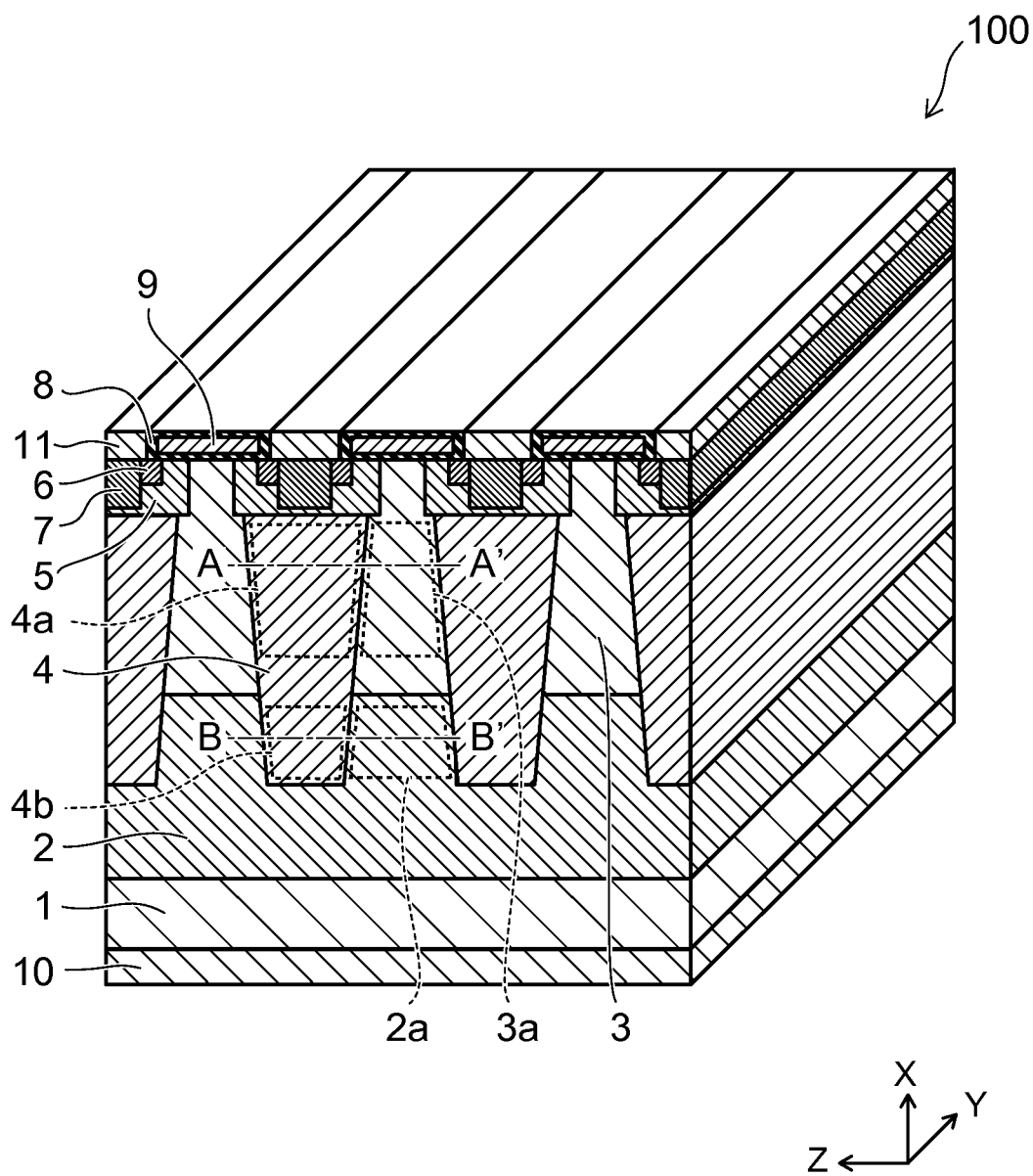
FIG. 1 is a perspective cross-sectional view showing a portion of a semiconductor device according to a first embodiment.

In general, according to one embodiment, a semiconductor device includes, a first semiconductor region of a first conductivity type, a plurality of second semiconductor regions of the first conductivity type, a plurality of third semiconductor regions of a second conductivity type, a fourth semiconductor region of the second conductivity type, a fifth semiconductor region of the first conductivity type, and a gate electrode.

The second semiconductor regions are selectively provided on the first semiconductor region. An impurity concentration of the first conductivity type in the second semiconductor region is higher than an impurity concentration of the first conductivity type in the first semiconductor region. The second semiconductor region extends in a first direction. The second semiconductor regions are provided separated from each other in a second direction orthogonal to the first direction.

The third semiconductor region extends in the first direction. The third semiconductor region includes a first portion and a second portion.

The first portion is provided between the second semiconductor regions adjacent to each other. An amount of impurity of the second conductivity type in the first portion is greater than an amount of impurity of the first conductivity type in the second semiconductor region contiguous to the first portion.

The second portion is arranged with a part of the first semiconductor region in the second direction. An amount of impurity of the second conductivity type in the second portion is smaller than an amount of impurity of the first conductivity type in the part of the first semiconductor region.

The fourth semiconductor region is provided on the third semiconductor region.

The fifth semiconductor region is provided on the fourth semiconductor region.

The gate electrode is provided on the fourth semiconductor region via a gate insulating film.

Hereinafter, embodiments of the invention will be described with reference to the drawings.

The drawings are schematic or conceptual. The relationship between the thickness and width of each portion and the ratio of size between the portions are not necessarily the same as the actual ones. Moreover, even when showing the same portion, the portion may be shown with different dimensions or ratios depending on the drawings.

In the specification and the drawings, components similar to those described previously with reference to the earlier drawings are denoted by the same reference numerals, and a detailed description is appropriately omitted.

(First Embodiment)

FIG. 1 is a perspective cross-sectional view showing a portion of a semiconductor device according to a first embodiment.

In the embodiment, a description is given of the case where a first conductivity type is an n type while a second conductivity type is a p type. However, the first conductivity type may be the p type while the second conductivity type may be the n type.

A semiconductor device 100 is, for example, a MOSFET.

The semiconductor device 100 includes a first semiconductor region of the first conductivity type, a plurality of second semiconductor regions of the first conductivity type, a plurality of third semiconductor regions of the second conductivity type, fourth semiconductor regions of the second conductivity type, fifth semiconductor regions of the first conductivity type, and gate electrodes.

The first semiconductor region is, for example, an n-type semiconductor region 2. The second semiconductor region is, for example, an n-pillar region 3. The third semiconductor region is, for example, a p-pillar region 4. The fourth semiconductor region is, for example, a p-base region 5. The fifth semiconductor region is, for example, a source region 6.

The n-type semiconductor region 2 is provided on a drain region 1. The concentration of impurity of the first conductivity type in the n-type semiconductor region 2 is lower than the concentration of impurity of the first conductivity type in the drain region 1.

The n-pillar region 3 is selectively provided on the n-type semiconductor region 2. The concentration of impurity of the first conductivity type in the n-pillar region 3 is higher than the concentration of impurity of the first conductivity type in the n-type semiconductor region 2. The concentration of impurity of the first conductivity type in the n-pillar region 3 is lower than the concentration of impurity of the first conductivity type in the drain region 1. The n-pillar region 3 extends in a Y-direction (first direction). A plurality of n-pillar regions 3 are provided separated from each other in a Z-direction (second direction) orthogonal to the Y-direction.

The p-pillar regions 4 are selectively provided on the n-type semiconductor region 2 so that each of the p-pillar regions 4 is located between the n-pillar regions 3 adjacent to each other. That is, the plurality of n-pillar regions 3 and a plurality of p-pillar regions 4 are alternately provided in the Z-direction. The concentration of impurity of the second conductivity type in the p-pillar region 4 is higher than the concentration of impurity of the first conductivity type in the n-type semiconductor region 2. The p-pillar region 4 extends in the Y-direction. The plurality of p-pillar regions 4 are provided separated from each other in the Z-direction.

The n-type semiconductor region 2 includes portions 2*a*. The n-pillar region 3 includes a portion 3*a*. The p-pillar region 4 includes a portion 4*a* (first portion) and a portion 4*b* (second portion).

The portion 4*a* of the p-pillar region 4 is provided between adjacent n-pillar regions 3. The portion 4*a* is provided at the same depth as the portion 3*a* of the n-pillar region 3. That is, the portion 4*a* is arranged with the portion 3*a* in the Z-direction.

A part of the n-type semiconductor region 2 is provided between the p-pillar region 4 and the drain region 1 in the X-direction. The portion 4*b* is provided at the same depth as the portion 2*a* of the n-type semiconductor region 2. That is, the portion 4*b* is arranged with the portion 2*a* in the Z-direction.

The length of the n-pillar region 3 in the Z-direction decreases in an X-direction orthogonal to the Y-direction and the Z-direction. Therefore, the length in the Z-direction of an upper portion of the n-pillar region 3 is shorter than the length in the Z-direction of a lower portion of the n-pillar region 3.

On the other hand, the length in the Z-direction of the p-pillar region 4 increases in the X-direction. Therefore, the length in the Z-direction of the portion 4*a* is longer than the length in the Z-direction of the portion 4*b*.

The concentration of impurity of the second conductivity type in the portion 4*a* is equal to the concentration of impurity of the first conductivity type in the portion 3*a* arranged with the portion 4*a* in the Z-direction. The length in the Z-direction of the portion 4*a* is longer than the length in the Z-direction of the portion 3*a*. For this reason, the amount of impurity of the second conductivity type contained in the portion 4*a* is greater than the amount of impurity of the first conductivity type contained in the portion 3*a*.

The concentration of impurity of the second conductivity type in the portion 4*b* is higher than the concentration of impurity of the first conductivity type in the portion 2*a* arranged with the portion 4*b* in the Z-direction. The length in the Z-direction of the portion 4*b* is shorter than the length in the Z-direction of the portion 2*a*. The amount of impurity of the second conductivity type contained in the portion 4*b* is smaller than the amount of impurity of the first conductivity type contained in the portion 2*a*.

The amount of impurity in each of the regions can be obtained from, for example, the product of the concentration of impurity in each of the regions and the volume of each of the regions.

The carrier concentrations of each semiconductor region are proportionate to impurity concentrations of each semiconductor region.

Thus, in an example described in FIG. 1, a carrier concentration of the first conductivity type in a center portion in the Z-direction of the portion 3*a* may be equal to a carrier concentration of the second conductivity type in a center portion in the Z-direction of the portion 4*a*. A length in the Z-direction of the portion 4*a* may be longer than a length in the Z-direction of the portion 3*a*.

A carrier concentration of the second conductivity type in a center portion in the Z-direction of the portion 4*b* may be higher than a carrier concentration of the first conductivity type in a center portion in the Z-direction of the portion 2*a*. A length in the Z-direction of the portion 4*b* may be shorter than a length in the Z-direction of the portion 2*a*.

Relative levels of impurity concentrations in each semiconductor region and lengths of each semiconductor region are measured, for example, by a SCM (scanning capacitance microscopy).

The carrier concentration in the center portion of the portion 4*a*, the carrier concentration in the center portion of the portion 3*a*, the length in the Z-direction of the portion 4*a*, and the length in the Z-direction of the portion 3*a* can be determined, for example, by measuring a distribution of a carrier concentration on A-A' line described in FIG. 1 with SCM.

Similarly, the carrier concentration in the center portion of the portion 4*b*, the carrier concentration in the center portion of the portion 2*a*, the length in the Z-direction of the portion 4*b*, and the length in the Z-direction of the portion 2*a* can be determined, for example, by measuring a distribution of a carrier concentration on B-B' line described in FIG. 1 with SCM.

The A-A' line passes through a center in the Z-direction of the n-pillar region 3 and extends in the X-direction. The B-B' line passes through a center in the Z-direction of the p-pillar region 4 and extends in the X-direction.

Carrier concentrations in each portion described above may include variation. When a proportion of a carrier concentration of one portion to a carrier concentration of another portion is not less than 0.85:1 and not more than 1.15:1, the carrier concentrations of the portions can be assumed inherently same.

The n-pillar region 3 and a portion of the p-pillar region 4 form a so-called super junction structure.

In the following description, a region composed of the n-pillar region 3 and the portion 4a and forming the super junction structure is referred to as a drift region.

The p-base region 5 is selectively provided on the drift region.

The source region 6 is provided on the p-base region 5. The concentration of impurity of the first conductivity type in the source region 6 is higher than the concentration of impurity of the first conductivity type in the n-pillar region 3. The p-base region 5 and the source region 6 extend in the Y-direction. A plurality of p-base regions 5 and a plurality of source regions 6 are provided in the Z-direction.

Each of the contact regions 7 is provided on the p-base region 5. The contact region 7 is provided between the source regions 6 which are provided on the same p-base region 5. The concentration of impurity of the second conductivity type in the contact region 7 is higher than the concentration of impurity of the second conductivity type in the p-base region 5. The contact regions 7 are connected with a source electrode 11 described later. The contact region 7 is not an essential configuration for the embodiment. However, for efficiently discharging holes in the n-pillar region 3 into the source electrode 11, it is favorable to provide the contact region 7. The contact region 7 extends in the Y-direction. A plurality of contact regions 7 are provided in the Z-direction.

Gate electrodes 9 are provided on the n-pillar regions 3 and the p-base regions 5 via a gate insulating film 8. The gate electrode 9 is opposed to a portion of the n-pillar region 3 and portions of the p-base regions 5. The gate electrode 9 extends in the Y-direction. A plurality of gate electrodes 9 are provided in the Z-direction.

By applying a voltage of a threshold value or more to the gate electrode 9, the MOSFET is brought into an on state, so that a channel (inversion layer) is formed on a surface of the p-base region 5.

When the MOSFET is in an off state, a depletion layer spreads from a p-n junction plane between the n-pillar region 3 and the p-pillar region 4 to the n-pillar region 3 and the p-pillar region 4. With the depletion layer spreading to the n-pillar region 3 and the p-pillar region 4, the breakdown voltage can be improved.

A drain electrode 10 is provided on a face of the drain region 1 on the side opposite to the n-type semiconductor region 2. The drain electrode 10 is connected to the drain region 1.

The source electrode 11 is provided on the source regions 6 and the contact region 7 and connected with the regions.

Here, an example of a method for manufacturing the semiconductor device 100 will be described with reference to FIGS. 2A to 2D.

FIGS. 2A to 2D are process cross-sectional views showing the manufacturing process of the semiconductor device 100 according to the first embodiment.

Figure 2A:
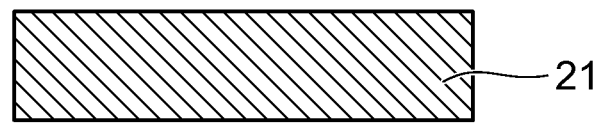
FIGS. 2A to 2D are process cross-sectional views showing the manufacturing process of the semiconductor device according to the first embodiment.

First, as shown in FIG. 2A, a semiconductor substrate 21 of the first conductivity type is prepared.

Figure 2B:
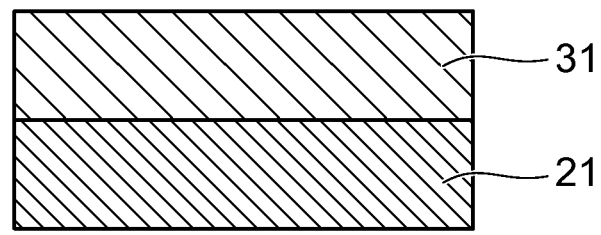

Next, as shown in FIG. 2B, a semiconductor layer 31 of the first conductivity type is epitaxially grown on the semiconductor substrate 21.

Figure 2C:
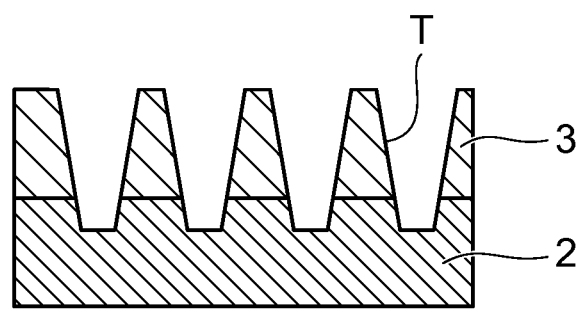

Next, as shown in FIG. 2C, trenches T are formed in the semiconductor substrate 21 and the semiconductor layer 31 epitaxially grown. The trenches T are formed by, for example, a RIE (Reactive Ion Etching) method. The trench T is formed such that the width of an upper portion of the trench T is wider than the width of a lower portion thereof.

By adjusting the type of reactive gas, the pressure of reactive gas, input power, or the like when forming the trenches by a RIE method, the width of the upper portion of the trench T and the width of the lower portion of the trench T can be controlled. A portion of the semiconductor substrate 21 after the trenches T being formed corresponds to the n-type semiconductor region 2. The semiconductor layer 31 after the trenches T being formed corresponds to the n-pillar regions 3.

Figure 2D:
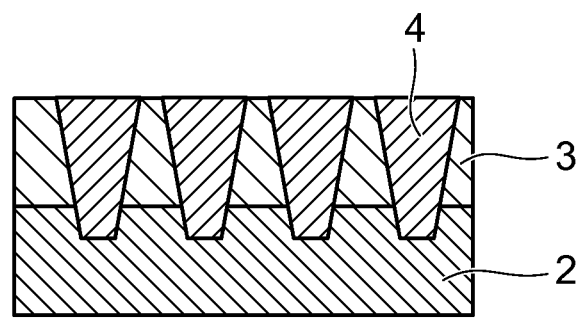

Next, as shown in FIG. 2D, a semiconductor layer of the second conductivity type is epitaxially grown in the trenches T to form the p-pillar regions 4.

Next, the source regions 6, the contact regions 7, the gate insulating film 8, the gate electrodes 9, and the source electrodes 11 are formed on the drift region. Then, the drain region 1 is formed in a region of the n-type semiconductor region 2 on the side opposite to the drift region, and the drain electrode 10 is formed on the drain region 1, so that the semiconductor device 100 shown in FIG. 1 is obtained.

In FIGS. 2A to 2D, an example is shown in which trenches are formed by a RIE method and a semiconductor layer is epitaxially grown in the trenches. This is not restrictive, and the p-pillar region 4 may be formed by ion implantation so that a length in the Z-direction of an upper portion of the p-pillar region 4 is longer than a length in the Z-direction of a lower portion of the p-pillar region 4. However, for the easiness of manufacture and a decrease in the variation of the concentration of impurity in the p-pillar region 4, the method in which a trench is formed and the p-pillar region 4 is formed therein is preferable.

The operations and advantageous effects of the embodiment will be described.

First, by making the amount of impurity of the second conductivity type in the portion 4a greater than the amount of impurity of the first conductivity type in the portion 3a of the n-pillar region 3 arranged with the portion 4a in the Z-direction, an electric field in the drift region can be intensified.

Next, by providing the portion 4b in the n-type semiconductor region 2, an electric field in the n-type semiconductor region 2 can be intensified. In this case, the electric field strength in the n-type semiconductor region 2 is affected by the electric field strength in the drift region. For this reason, by making the amount of impurity in the portion 4a greater than the amount of impurity in the portion 3a, and in addition, by providing the portion 4b in the n-type semiconductor region 2 as described above, a strong electric field is generated in the n-type semiconductor region 2. As a result, the breakdown voltage can be greatly improved.

On the other hand, by making the amount of impurity of the second conductivity type in the portion 4b smaller than the amount of impurity of the first conductivity type in the portion 2a of a buffer region arranged with the portion 4b in the Z-direction, an increase in on-resistance can be suppressed. That is, even when the portion 4b is provided in the n-type semiconductor region 2, the spread of the depletion layer extending from the portion 4b toward the Z-direction and a direction opposite to the Z-direction is suppressed, so that it is possible to suppress an increase in on-resistance.

The electric field intensified in the drift region and the n-type semiconductor region 2 suppresses the attenuation of electric field in the n-type semiconductor region 2 because the concentration of impurity of the first conductivity type in the n-type semiconductor region 2 is low, so that it is possible to further extend the electric field to a lower portion of the n-type semiconductor region 2.

According to the embodiment as described above, by intensifying the electric field in the drift region and the n-type semiconductor region 2, the breakdown voltage can be improved while suppressing an increase in on-resistance.

For further intensifying the electric field in the n-type semiconductor region 2, it is favorable for the portion 4b to have a length of 4 μm or more in the X-direction.

For further increasing the breakdown voltage while suppressing an increase in on-resistance in the semiconductor device, it is desired to satisfy the following two conditions.

The first condition is that the amount of impurity of the second conductivity type in the portion 4a is 1.1 times or less the amount of impurity of the first conductivity type in the portion 3a of the n-pillar region 3 arranged with the portion 4a in the Z-direction.

This is because when the amount of impurity of the second conductivity type in the portion 4a is more than 1.1 times the amount of impurity of the first conductivity type in the portion 3a, the difference between the amount of impurity of the second conductivity type in the portion 4a and the amount of impurity of the first conductivity type in the portion 3a is great, making it difficult to improve the breakdown voltage in the drift region.

The second condition is that the amount of impurity of the second conductivity type in the portion 4b is 0.9 times or less the amount of impurity of the first conductivity type in the portion 2a of the n-type semiconductor region 2 arranged with the portion 4b in the Z-direction.

This is because when the amount of impurity of the second conductivity type in the portion 4b is more than 0.9 times the amount of impurity of the first conductivity type in the portion 2a, the on-resistance in the n-type semiconductor region 2 may be increased.

Moreover, it is desired that the length of the n-pillar region 3 in the Z-direction decreases in the X-direction, and that the length of the p-pillar region 4 in the Z-direction increases in the X-direction. By adopting this configuration, more current can flow when the semiconductor device 100 is in the on state.

The reason for this is as follows.

When a voltage of a threshold value or more is applied to the gate electrode 9 to bring the semiconductor device 100 into the on state, current starts to flow between the drain electrode 10 and the source electrode 11. Consequently, the voltage between the drain electrode 10 and the source electrode 11 increases. Then, with the voltage between the drain electrode 10 and the source electrode 11, a depletion layer spreads from a p-n junction plane between the n-type semiconductor region 2 and the n-pillar region 3, and the p-pillar region 4. Since the depletion layer spreads, a current path in the n-type semiconductor region 2 and the n-pillar region 3 is narrowed. In this case, as the depletion layer spreads, the current path in the n-pillar region 3 is narrowed, so that the saturation current decreases. The depletion layer is more likely to spread on the drain electrode 10 side than the source electrode 11 side. Especially in the embodiment, since a portion of the p-pillar region 4 is provided in the n-type semiconductor region 2 where the concentration of impurity of the first conductivity type is low, the depletion layer in the n-type semiconductor region 2 is likely to spread.

As in the embodiment, however, the length of the portion 4b in the Z-direction is shortened, so that the length of the portion 2a in the Z-direction can be lengthened. As a result, compared to the case where the length of the portion 4a in the Z-direction is equal to the length of the portion 4b in the Z-direction, the width of the current path in the n-type semiconductor region 2 can be widened when the semiconductor device 100 is in the on state, so that it is possible to increase the saturation current.

(Second Embodiment)

A second embodiment of the invention will be described with reference to FIG. 3.

Figure 3:
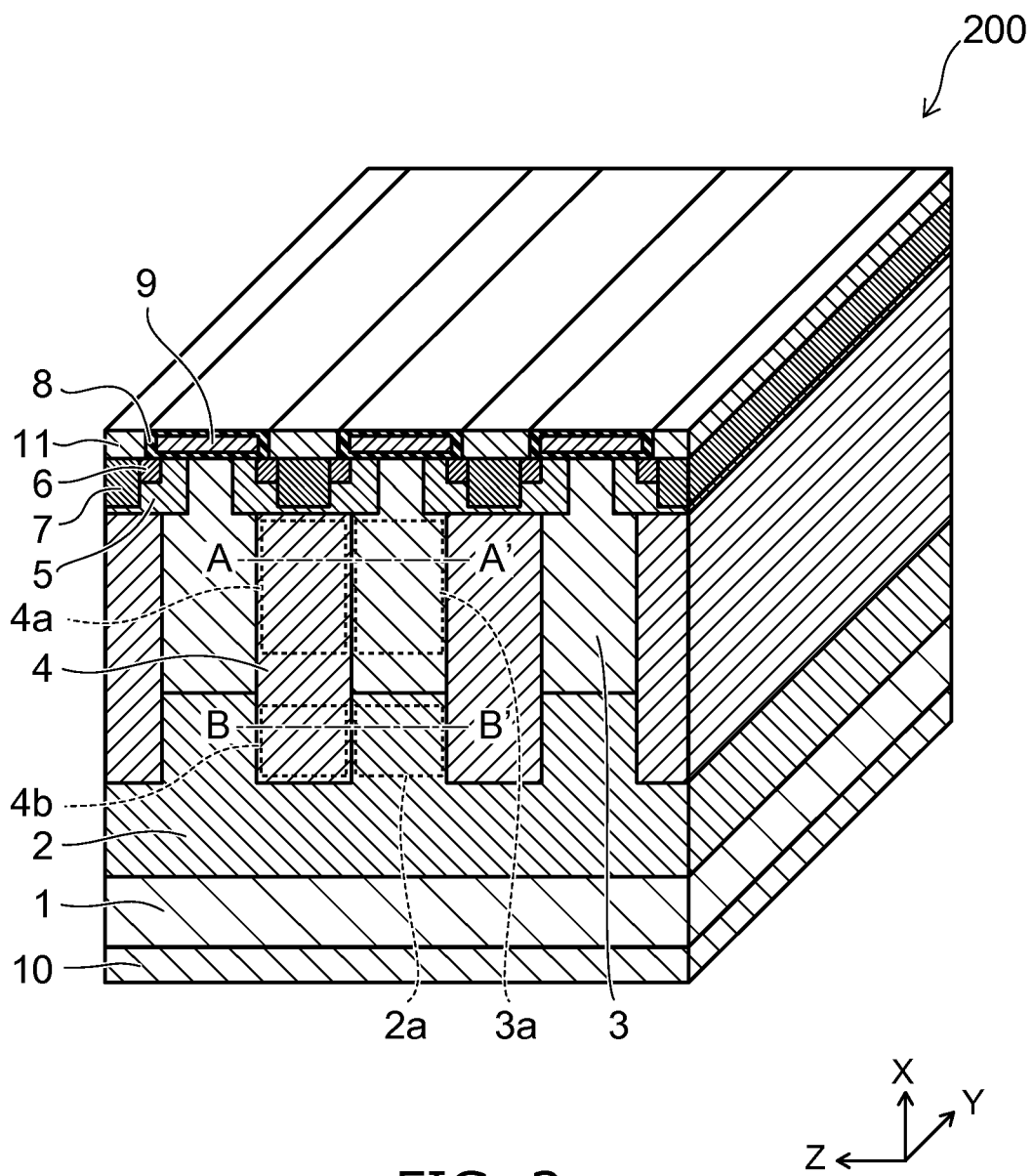
FIG. 3 is a perspective cross-sectional view showing a portion of a semiconductor device according to a second embodiment.

FIG. 3 is a perspective cross-sectional view showing a portion of a semiconductor device 200 according to the second embodiment.

In the following description of embodiments, a description on portions having structures or functions similar to those of the first embodiment is omitted, and portions different from the first embodiment will be mainly described.

In the first embodiment, the length of the n-pillar region 3 in the Z-direction and the length of the p-pillar region 4 in the Z-direction are changed in the X-direction, so that the amount of impurity in each of the regions is changed in the X-direction.

In contrast to this, in the embodiment, the concentration of impurity in the n-pillar region 3 and the concentration of impurity in the p-pillar region 4 are changed in the X-direction, so that the amount of impurity in each of the regions is changed in the X-direction.

The length of the n-pillar region 3 in the Z-direction is constant in the X-direction. That is, the length of the lower portion of the n-pillar region 3 in the Z-direction is equal to the length of the upper portion of the n-pillar region 3 in the Z-direction.

Similarly, also the length of the p-pillar region 4 in the Z-direction is constant in the X-direction. Therefore, the length of the portion 4a in the Z-direction is equal to the length of the portion 4b in the Z-direction.

The concentration of impurity of the second conductivity type in the portion 4a is higher than the concentration of impurity of the second conductivity type in the portion 4b.

The concentration of impurity of the second conductivity type in the portion 4a is higher than the concentration of impurity of the first conductivity type in the portion 3a. The length of the portion 4a in the Z-direction is equal to the length of the portion 3a in the Z-direction. For this reason, the amount of impurity of the second conductivity type in the portion 4a is greater than the amount of impurity of the first conductivity type in the portion 3a of the n-pillar region 3 arranged with the portion 4a in the Z-direction.

The concentration of impurity of the second conductivity type in the portion 4b is lower than the concentration of impurity of the first conductivity type in the portion 2a. The amount of impurity of the second conductivity type in the portion 4b is smaller than the amount of impurity of the first conductivity type in the portion 2a of the buffer region arranged with the portion 4b in the Z-direction.

In an example described in FIG. 3, in other words, a carrier concentration of the second conductivity type in a center portion in the Z-direction of the portion 4a may be higher than a carrier concentration of the first conductivity type in a center portion in Z-direction of the portion 3a. A length in the Z-direction of the portion 4a may be equal to a length in the Z-direction of the portion 3a.

A carrier concentration of the second conductivity type in a center portion in the Z-direction of the portion 4b may be lower than a carrier concentration of the first conductivity type in a center portion in the Z-direction of the portion 2a. A length in the Z-direction of the portion 4b may be equal to a length in the Z-direction of the portion 2a.

Relative levels of impurity concentrations in each semiconductor region and lengths of each semiconductor region are measured, for example, by SCM same as the first embodiment.

About the semiconductor device 200 described in FIG. 3, relationships between carrier concentrations in each semiconductor region and the lengths of each semiconductor region can be determined, for example, by measuring distributions of carrier concentrations on A-A' line and B-B' line with SCM.

The A-A' line passes through a center in the Z-direction of the n-pillar region 3 and extends in the X-direction. The B-B' line passes through a center in the Z-direction of the p-pillar region 4 and extends in the X-direction.

Lengths in the Z-direction of each portion described above may include variation. When a proportion of a length in the Z-direction of one portion to a length in the Z-direction of another portion is not less than 0.85:1 and not more than 1.15:1, the lengths can be assumed inherently same.

With the configuration described above, the breakdown voltage can be improved while suppressing an increase in on-resistance in the semiconductor device, similarly to the first embodiment.

(Variation)

Next, a variation of the second embodiment will be described with reference to FIG. 4.

Figure 4:
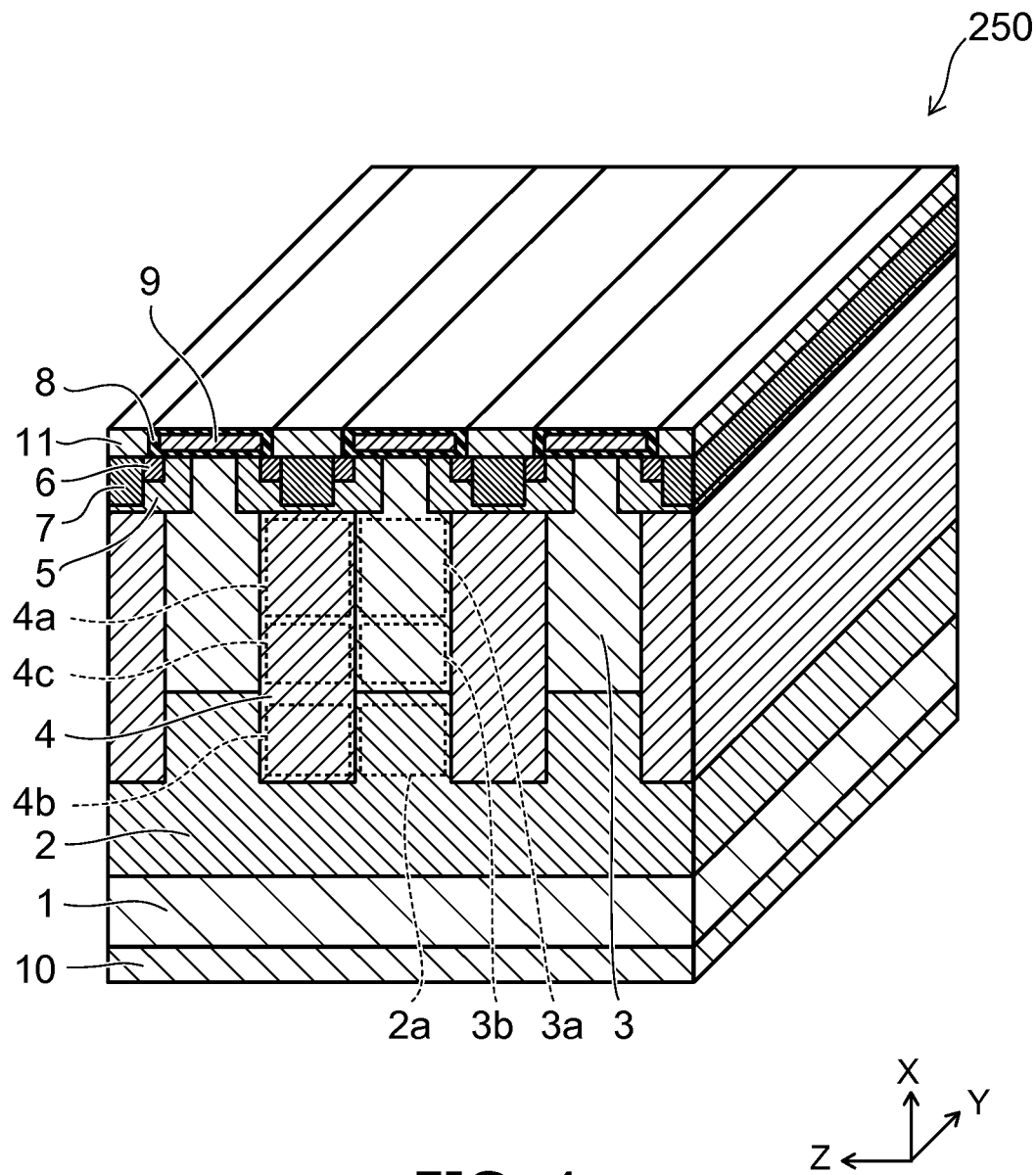
FIG. 4 is a perspective cross-sectional view showing a portion of a semiconductor device according to a variation of the second embodiment.

FIG. 4 is a perspective cross-sectional view showing a portion of a semiconductor device 250 according to the variation of the second embodiment.

In the variation, the n-pillar region 3 includes the portion 3a and a portion 3b. The portion 3a is provided closer to the X-direction side than the portion 3b. That is, the portion 3b is provided between the portion 3a and the n-type semiconductor region 2. The concentration of impurity of the first conductivity type in the portion 3a is higher than the concentration of impurity of the first conductivity type in the portion 3b.

The p-pillar region 4 includes the portion 4a, the portion 4b, and a portion 4c. The portion 4a is arranged with the portion 3a in the Z-direction. The portion 4c is arranged with the portion 3b in the Z-direction. The portion 4b is arranged with the portion 2a in the n-type semiconductor region 2 in the Z-direction. The concentration of impurity of the second conductivity type in the portion 4a is higher than the concentration of impurity of the second conductivity type in the portion 4c.

The concentration of impurity of the second conductivity type in the portion 4a is higher than the concentration of impurity of the first conductivity type in the portion 3a. The length of the portion 4a in the Z-direction is equal to the length of the portion 3a in the Z-direction. For this reason, the amount of impurity of the second conductivity type in the portion 4a is greater than the amount of impurity of the first conductivity type in the portion 3a of the n-pillar region 3 arranged with the portion 4a in the Z-direction.

The concentration of impurity of the second conductivity type in the portion 4c is higher than the concentration of impurity of the first conductivity type in the portion 3b. The length of the portion 4c in the Z-direction is equal to the length of the portion 3b in the Z-direction. For this reason, the amount of impurity of the second conductivity type in the portion 4c is greater than the amount of impurity of the first conductivity type in the portion 3a of the n-pillar region 3 arranged with the portion 4c in the Z-direction. However, the difference between the amount of impurity of the second conductivity type in the portion 4c and the amount of impurity of the first conductivity type in the portion 3a is smaller than the difference between the amount of impurity of the second conductivity type in the portion 4a and the amount of impurity of the first conductivity type in the portion 3a.

On the other hand, the amount of impurity of the second conductivity type in the portion 4b is smaller than the amount of impurity of the first conductivity type in the portion 2a of the buffer region arranged with the portion 4b in the Z-direction.

Also in the variation, the breakdown voltage can be improved while suppressing an increase in on-resistance in the semiconductor device, similarly to the first embodiment.

The semiconductor device 200 may further include portions having different impurity concentrations from each other in the n-pillar region 3 in the X-direction. Similarly, the semiconductor device 200 may further include portions having different impurity concentrations from each other in the p-pillar region 4 in the X-direction.

Alternatively, the concentration of impurity in the n-pillar region 3 may continuously change in the X-direction so as to include the portion 3a and the portion 3b. Similarly, the concentration of impurity in the p-pillar region 4 may continuously change in the X-direction so as to include the portion 4a, the portion 4b, and the portion 4c.

The embodiments have been specifically described so far. However, the concentration of impurity of the second conductivity type in the portion 4a, the length of the portion 4a in the Z-direction, the concentration of impurity of the first conductivity type in the portion 3a, and the length of the portion 3a in the Z-direction can be appropriately changed in a range where the amount of impurity of the second conductivity type in the portion 4a is greater than the amount of impurity of the first conductivity type in the portion 3a.

Similarly, the concentration of impurity of the second conductivity type in the portion 4b, the length of the portion 4b in the Z-direction, the concentration of impurity of the first conductivity type in the portion 2a, and the length of the portion 2a in the Z-direction can be appropriately changed in a range where the amount of impurity of the second conductivity type in the portion 4b is smaller than the amount of impurity of the first conductivity type in the portion 2a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor region of a first conductivity type;
a plurality of second semiconductor regions of the first conductivity type selectively provided on the first semiconductor region, an impurity concentration of the first conductivity type in the second semiconductor region being higher than an impurity concentration of the first conductivity type in the first semiconductor region, the second semiconductor region extending in a first direction, and the plurality of second semiconductor regions provided separated from each other in a second direction orthogonal to the first direction;

a plurality of third semiconductor regions of a second conductivity type extending in the first direction, the third semiconductor region including a first portion and a second portion, the first portion provided between the second semiconductor regions adjacent to each other and an amount of impurity of the second conductivity type in the first portion being greater than an amount of impurity of the first conductivity type in the second semiconductor region contiguous to the first portion, the second portion arranged with a part of the first semiconductor region in the second direction, an amount of impurity of the second conductivity type in the second portion being smaller than an amount of impurity of the first conductivity type in the part of the first semiconductor region;

a fourth semiconductor region of the second conductivity type provided on the third semiconductor region;

a fifth semiconductor region of the first conductivity type provided on the fourth semiconductor region;

a sixth semiconductor region of the second conductivity type provided on the fourth semiconductor region, an impurity concentration of the second conductivity type in the sixth semiconductor region being higher than an impurity concentration of the second conductivity type in the fourth semiconductor region; and a gate electrode provided on the fourth semiconductor region via a gate insulating film.

2. The device according to claim 1, wherein
a length in the second direction of the first portion is longer than a length in the second direction of the second portion.

3. The device according to claim 2, wherein
an impurity concentration of the second conductivity type in the first portion is equal to an impurity concentration of the second conductivity type in the second portion.

4. The device according to claim 2, wherein
an impurity concentration of the second conductivity type in the first portion is higher than an impurity concentration of the second conductivity type in the second portion.

5. The device according to claim 1, wherein
a length in the second direction of the first portion is equal to a length in the second direction of the second portion.

6. The device according to claim 5, wherein
an impurity concentration of the second conductivity type in the first portion is higher than an impurity concentration of the second conductivity type in the second portion.

7. The device according to claim 1, wherein
an impurity concentration of the second conductivity type in the first portion is higher than the impurity concentration of the first conductivity type in the second semiconductor region.

8. The device according to claim 7, wherein
a length in the second direction of the first portion is equal to a length in the second direction of the second semiconductor region.

9. The device according to claim 7, wherein
a length in the second direction of the first portion is longer than a length in the second direction of the second semiconductor region.

10. The device according to claim 1, wherein
a length in a third direction of the second portion is 4 μm or more and the third direction is orthogonal to the first direction and the second direction.

11. The device according to claim 1, wherein
the amount of impurity of the second conductivity type in the first portion is 1.1 times or less the amount of impurity of the first conductivity type in the second semiconductor region contiguous to the first portion, and
the amount of impurity of the second conductivity type in the second portion is 0.9 times or less the amount of impurity of the first conductivity type in a third portion in the first semiconductor region contiguous to the second portion.

12. A semiconductor device comprising:
a first semiconductor region of a first conductivity type;
a plurality of second semiconductor regions of the first conductivity type selectively provided on the first semiconductor region, an impurity concentration of the first conductivity type in the second semiconductor region being higher than an impurity concentration of the first conductivity type in the first semiconductor region, the second semiconductor region extending in a first direction, and the plurality of second semiconductor regions provided separated from each other in a second direction orthogonal to the first direction;
a plurality of third semiconductor regions of a second conductivity type extending in the first direction, the third semiconductor region including a first portion and a second portion, the first portion provided between the second semiconductor regions adjacent to each other and an amount of impurity of the second conductivity type in the first portion being greater than an amount of impurity of the first conductivity type in the second semiconductor region contiguous to the first portion, the second portion arranged with a part of the first semiconductor region in the second direction, an amount of impurity of the second conductivity type in the second portion being smaller than an amount of impurity of the first conductivity type in the part of the first semiconductor region, a length in the second direction of the first portion is longer than a length in the second direction of the second portion, an impurity concentration of the second conductivity type in the first portion is equal to an impurity concentration of the second conductivity type in the second portion;

a fourth semiconductor region of the second conductivity type provided on the third semiconductor region;
a fifth semiconductor region of the first conductivity type provided on the fourth semiconductor region; and
a gate electrode provided on the fourth semiconductor region via a gate insulating film.

13. The device according to claim 12, wherein
a length in a third direction of the second portion is 4 μm or more and the third direction is orthogonal to the first direction and the second direction.

14. A semiconductor device comprising:
a first semiconductor region of a first conductivity type;
a plurality of second semiconductor regions of the first conductivity type selectively provided on the first semiconductor region, an impurity concentration of the first conductivity type in the second semiconductor region being higher than an impurity concentration of the first conductivity type in the first semiconductor region, the second semiconductor region extending in a first direction, and the plurality of second semiconductor regions provided separated from each other in a second direction orthogonal to the first direction;

a plurality of third semiconductor regions of a second conductivity type extending in the first direction, the third semiconductor region including a first portion and a second portion,
   the first portion provided between the second semiconductor regions adjacent to each other and an amount of impurity of the second conductivity type in the first portion being greater than an amount of impurity of the first conductivity type in the second semiconductor region contiguous to the first portion,
   the second portion arranged with a part of the first semiconductor region in the second direction, an amount of impurity of the second conductivity type in the second portion being smaller than an amount of impurity of the first conductivity type in the part of the first semiconductor region, an impurity concentration of the second conductivity type in the first portion is higher than the impurity concentration of the first conductivity type in the second semiconductor region, a length in the second direction of the first portion is longer than a length in the second direction of the second semiconductor region;
a fourth semiconductor region of the second conductivity type provided on the third semiconductor region;
a fifth semiconductor region of the first conductivity type provided on the fourth semiconductor region; and
a gate electrode provided on the fourth semiconductor region via a gate insulating film.

15. The device according to claim 14, wherein
a length in a third direction of the second portion is 4 μm or more and the third direction is orthogonal to the first direction and the second direction.

* * * * *